United States Patent
Fujiuchi

(10) Patent No.: US 7,020,813 B2
(45) Date of Patent: Mar. 28, 2006

(54) ON CHIP DEBUGGING METHOD OF MICROCONTROLLERS

(75) Inventor: Hisashi Fujiuchi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 425 days.

(21) Appl. No.: 10/259,861

(22) Filed: Sep. 30, 2002

(65) Prior Publication Data

US 2003/0226081 A1    Dec. 4, 2003

(30) Foreign Application Priority Data

Jun. 4, 2002    (JP)    ............................ 2002-162837

(51) Int. Cl.
    *G01R 31/28*    (2006.01)
(52) U.S. Cl. .................... 714/712; 714/724; 714/30
(58) Field of Classification Search ................ 714/712, 714/724, 718, 699, 100, 25, 30, 32, 37, 40, 714/48

See application file for complete search history.

(56) References Cited

U.S. PATENT DOCUMENTS

| | | | |
|---|---|---|---|
| 5,379,382 A * | 1/1995 | Work et al. ................. 710/63 |
| 5,537,607 A * | 7/1996 | Ploger, III ................... 710/10 |
| 5,737,638 A * | 4/1998 | Byrn et al. .................. 710/68 |
| 6,467,009 B1 * | 10/2002 | Winegarden et al. ....... 710/305 |

* cited by examiner

*Primary Examiner*—Albert Decady
*Assistant Examiner*—Dipakkumar Gandhi
(74) *Attorney, Agent, or Firm*—Wenderoth, Lind, & Ponack, L.L.P.

(57) ABSTRACT

A microcontroller includes an external interface terminal group, a data transmit/receive section, and a DMA controller comprised of an address register for storing therein an address of a hardware serving as an object to be accessed by DMA, registers for executing read/write by the DMA, a control flag for controlling the start of the DMA, and a timing controller of the DMA. The microcontroller further includes a register for storing therein flag information for determining whether access can be executed or not by the DMA and a unit for outputting a bus state recognition signal indicating whether a bus state is rendered in a state to be accessed or not by the DMA.

3 Claims, 4 Drawing Sheets

ON CHIP DEBUGGING METHOD OF MICROCONTROLLERS

FIELD OF THE INVENTION

The present invention relates to an on-chip debugging method (hereinafter referred to as a RAM monitor) which is capable of debugging and tuning a microcontroller unit (hereinafter referred to as a MCU) in a state implemented on a chip.

BACKGROUND OF THE INVENTION

The latest one chip MCU frequently has a RAM monitor function for debugging and tuning an internal program of the MCU in a state implemented on a chip (hereinafter referred to as MCU 100 with a built-in RAM monitor or simply referred to as MCU 100). FIG. 1 shows the configuration of a conventional MCU 100.

The RAM monitor function can be realized when the MCU 100 receives an external clock and external data and outputs data by way of an external interface terminal group 102.

The conventional MCU 100 comprises an external interface terminal group 102, a data transmit/receive section 104, a direct memory access control circuit (hereinafter referred to as DMA controller) 110, and also comprises a CPU 120, a ROM 130, a RAM 140, a peripheral module 1 (150) and a peripheral module 2 (160) respectively connected with one another by way of an internal bus formed of a data bus (DBUS) 106 and an address bus (ABUS) 108.

The DMA controller 110 comprises a GO flag set F/F 111, an AND gate 115, an address register (AReg) 112, a data write register (WReg) 113, a data read register (RReg) 114, and a timing controller 116.

The GO flag set F/F 111 is set upon completion of reception of an address/data from the transmit/receive section 104 and reset upon completion of a DMA transfer operation. An output signal from the GO flag set F/F 111 is inputted to the AND gate 115 together with a bus state recognition signal 101 and generates a DMA start signal 124. The bus state recognition signal 101 is a signal which takes an insignificant value (e.g. "0") when the CPU 120 occupies the bus and the DMA is placed in a bus use prohibition state, and which takes a significant value (e.g. "1") when the CPU 120 releases the bus and the DMA is placed in a bus use permission state.

Further, the timing controller 116 executes write/read relative to the registers, the RAM and the like by the DMA operation at a given timing at the time when a GO flag is set by the GO flag set F/F 111 and the bus state recognition signal 101 takes the significant value and the operation of the timing controller 116 is reserved until a starting condition is prepared.

The RAM monitor function is a function to read or rewrite contents of the RAM 140 and registers of the peripheral modules 1 and 2 inside the MCU 100 during the normal operation of the MCU 100, namely, during the operation of the MCU 100 by an application program (hereinafter referred to as AP) which is written in the ROM 130.

In the case of reading data, in FIG. 1, when an address of a RAM or addresses of registers, namely, the RAM 140, the peripheral module 1 (150) and the peripheral module 2 (160) which are provided in the MCU 100 and subjected to debugging are inputted from an external data input/output terminal (hereinafter referred to simply as external data i/o terminal) in synchronization with an external clock from the external interface terminal group 102, necessary data is set in the DMA controller 110 by way of the data transmit/receive section 104. The DMA controller 110 reads data in the RAM or registers serving as objects of set addresses by way of the internal bus, and outputs the read data to the outside by way of the data transmit/receive section 104 and the external interface terminal group 102.

In the case of writing data, when an address of a RAM or addresses of registers, namely, the RAM 140, the peripheral module 1 (150) and the peripheral module 2 (160) which are provided in the MCU 100 and subjected to debugging and data to be written are inputted from the external data i/o terminal in synchronization with the external clock from the external interface terminal group 102, necessary data is set in the DMA controller 110 by way of the data transmit/receive section 104. The DMA controller 110 rewrites data stored in the RAM or registers serving as objects of set addresses by way of the internal bus, and outputs a signal indicating the completion of execution of writing to the outside by way of the data transmit/receive section 104 and the external interface terminal group 102.

However, in the conventional method, since a point (a state of program counter (PC 121) inside the CPU 120) where the data in the RAM and registers inside the MCU 100 are read or data is written on the RAM and registers is a time upon completion of setting the DMA controller 110 after setting data from the external interface terminal group 102, such a point can not be set from the outside, causing a problem of lack of flexibility of debugging and another problem of low accuracy of debugging.

Under the circumstances, an on-chip debugging method of a MCU which is improved in flexibility and accuracy of debugging has been desired.

SUMMARY OF THE INVENTION

In an on-chip debugging method of a MCU according to a first aspect of the invention, the MCU comprises an external interface terminal group for executing transmission and reception of data relative to an outside, a data transmit/receive section for executing transmission and reception of data between the external interface terminal group and a DMA controller, the DMA controller having an address register for storing therein an address of a hardware serving as an object to be accessed by DMA, registers for executing reading or writing by the DMA, a control flag for controlling the start of the DMA, and a timing controller of the DMA. The MCU further includes outside thereof a register for storing therein flag information for determining whether access can be executed or not by the DMA, and a unit for outputting a bus state recognition signal indicating whether a bus state of the MCU is in a state to be accessed or not by the DMA, wherein when the flag information indicates that access can be executed by the DMA and the bus state recognition signal indicates that the bus can be occupied by the DMA, and the control flag inside the DMA controller indicates that access is started by the DMA, the built-in RAM or registers are accessed under the control of the timing controller of the DMA inside the DMA controller so that data is read from the RAM or registers to the outside of the MCU or data is written to the RAM or registers from the outside.

In an on-chip debugging method of a MCU according to a second aspect of the invention, the MCU comprises an external interface terminal group for executing transmission and reception of data relative to an outside, a data transmit/receive section for executing transmission and reception of data between the external interface terminal group and a DMA controller, the DMA controller having an address register for storing therein an address of a hardware serving as an object to be accessed by DMA, a decoder for decoding a content of the address register, registers for executing reading or writing by the DMA, a control flag for controlling the start of the DMA, and a timing controller of the DMA. The MCU further includes outside thereof a register for storing therein a DMA control flag group corresponding to each hardware one by one for executing access by the DMA, and a unit for outputting a bus state recognition signal indicating whether a bus state of the MCU is in a state to be accessed or not by the DMA, wherein when a flag selected from among the DMA control flag group in response to a signal outputted by the decoder indicates that the DMA operation is valid, and the bus state recognition signal indicates that the bus can be occupied by the DMA, and the control flag inside the DMA controller indicates that access is started by the DMA, the built-in RAM or registers are accessed under the control of the timing controller of the DMA inside the DMA controller so that data is read from the RAM or registers to the outside of the MCU or data is written to the RAM or registers from the outside.

In an on-chip debugging method according to a third aspect of the invention, the MCU comprises an external interface terminal group for executing transmission and reception of data relative to an outside, a data transmit/receive section for executing transmission and reception of data between the external interface terminal group and a DMA controller; the DMA controller having an address register for storing therein an address of a hardware serving as an object to be accessed by DMA, a register for inputting data indicating which flag of a DMA control flag is referred to, a decoder for decoding a content of the register, registers for executing reading or writing by the DMA, a control flag for controlling the start of the DMA, and a timing controller of the DMA. The MCU further includes outside thereof a register for storing therein a DMA control flag group indicating whether each hardware for executing access by the DMA can be accessed or not by the DMA, and a unit for outputting a bus state recognition signal indicating whether a bus state of the MCU is in a state to be accessed or not by the DMA, wherein when a flag selected from among the DMA control flag group in response to a signal outputted by the decoder indicates that the DMA operation is valid, and the bus state recognition signal indicates that access can be executed by the DMA, and the control flag inside the DMA controller indicates that access is started by the DMA, the built-in RAM or registers are accessed under the control of the timing controller of the DMA inside the DMA controller so that data is read from the RAM or registers to an outside of the MCU or data is written on the RAM or registers from the outside.

PREFERRED EMBODIMENTS OF THE INVENTION

Preferred embodiments of the invention are described hereinafter with reference to the attached drawings.

First Embodiment

Figure 1:
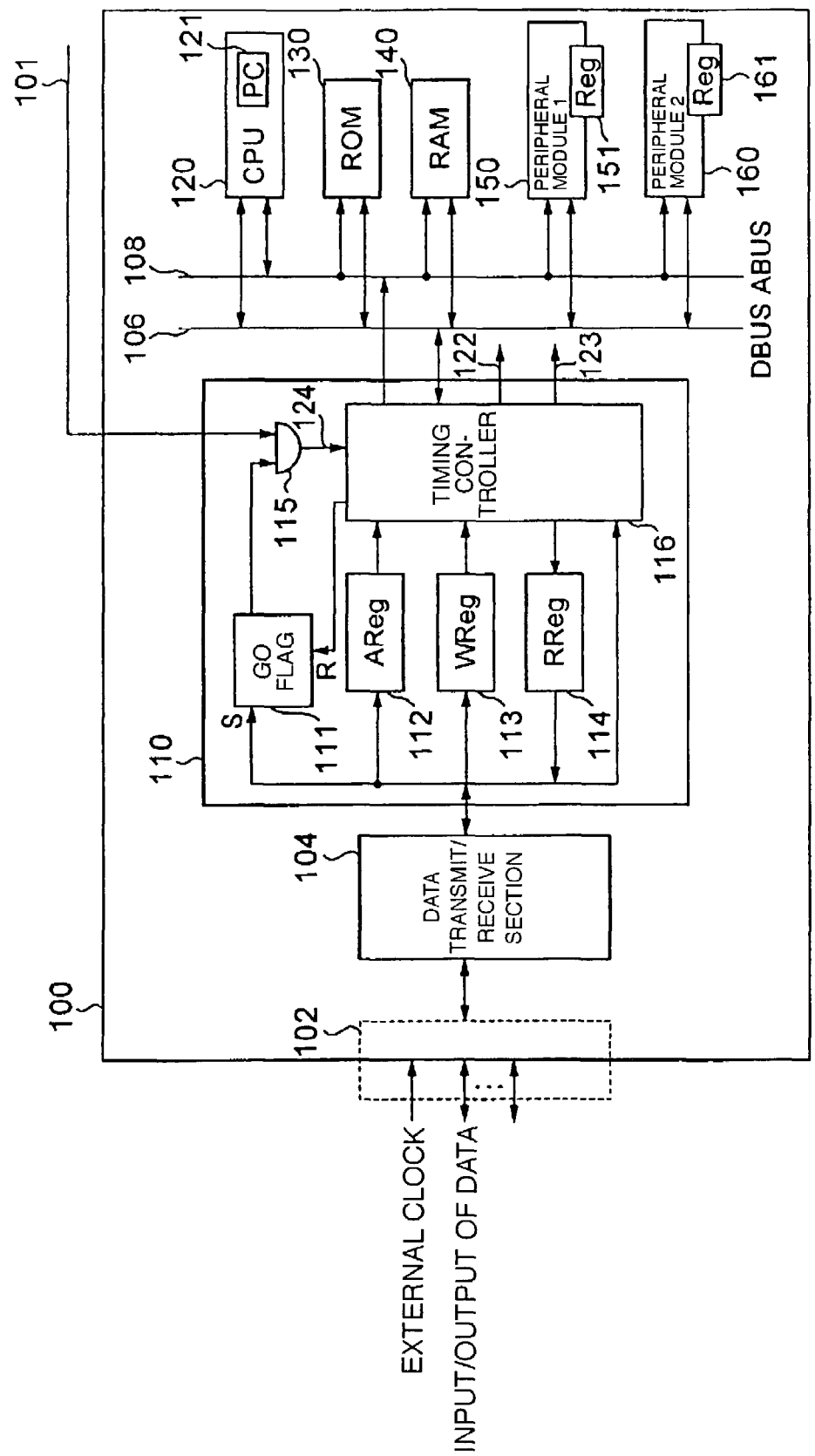
FIG. 1 is a block diagram showing an example of the configuration of a conventional MCU.
Figure 2:
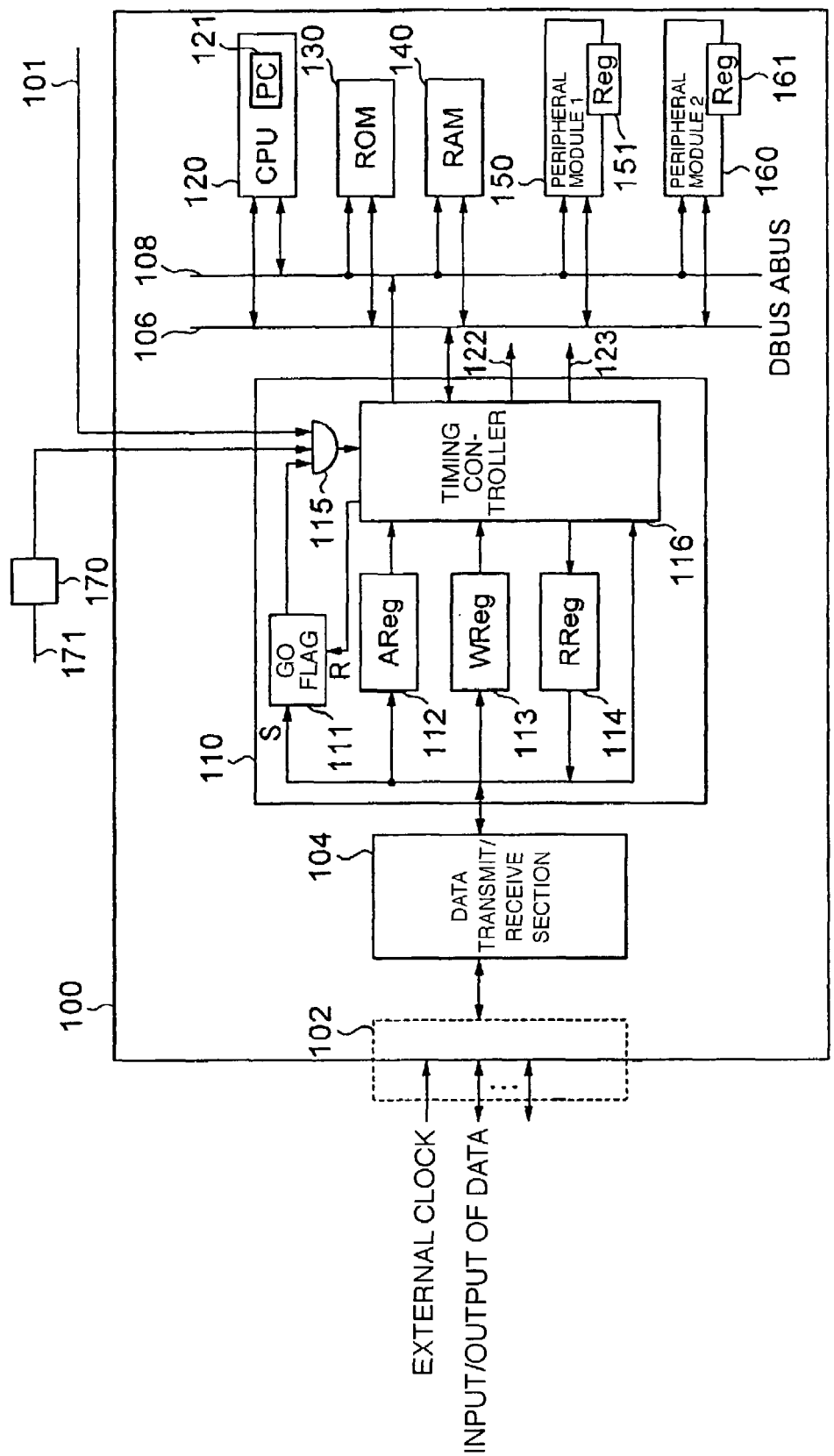
FIG. 2 is a block diagram showing an on-chip debugging method according to a first embodiment of the invention.

FIG. 2 is a block diagram showing the configuration of a MCU 100 according to a first embodiment of the invention. In FIG. 2, since components which are depicted by the same reference numerals as those illustrated in FIG. 1 have the same functions as those of the MCU illustrated in FIG. 1, a detailed explanation thereof is omitted.

In the first embodiment, a DMA control flag 170 is provided and it is normally realized or formed of a flip—flip (F/F) and the like. A write signal 171 is inputted to the DMA control flag 170 by an AP and the DMA control flag 170 is arbitrarily set or reset by the AP. An output of the DMA control flag 170 is inputted to an AND gate 115 as one of three inputs. The remaining two inputs of the AND gate 115 are the same as those of the conventional MCU shown in FIG. 1.

(1) Reading Operation

An address of a RAM or addresses of registers, namely, the RAM 140, the peripheral module 1 (150) and a peripheral module 2 (160) which are provided in the MCU 100 and subjected to debugging are inputted from an external data i/o terminal in synchronization with an external clock from the external interface terminal group 102 in FIG. 2, and data necessary for the operation of the DMA controller 110 is set in an AReg 112 by way of a data transmit/receive section 104. Upon completion of this setting process, a GO flag set F/F 111 is set. At this time, if a bus state recognition signal has a significant value (e.g. a value "1") and an output of the DMA control flag 170 set by the AP has a significant value (e.g. a value "0"), the DMA controller 110 reads content of the RAM or registers serving as objects of set addresses by way of a DBUS 106, and outputs the read data to the outside by way of the data transmit/receive section 104 and the external interface terminal group 102.

(2) Writing Operation

An address of a RAM or addresses of registers, namely, the RAM 140, the peripheral module 1 (150) and the peripheral module 2 (160) which are provided in the MCU 100 and subjected to debugging and data to be written are inputted from the external data i/o terminal in synchronization with the external clock from the external interface terminal group 102, and data necessary for the operation of the DMA controller 110 is set in the Areg 112 and a WReg 113 by way of the data transmit/receive section 104. Upon completion of this setting process, the GO flag set F/F 111 is set. At this time, if a bus state recognition signal has a significant value and an output of the DMA control flag 170 set by the AP has a significant value, the DMA controller 110 writes data on the RAM or registers serving as objects of set addresses by way of the DBUS 106, and outputs a signal indicating the completion of execution of write to the outside by way of the external interface terminal group 102.

In the first embodiment, although the setting of data for executing read/write by the RAM monitor from the external interface terminal group 102 is the same as the conventional method, there is provided the DMA control flag 170 capable of programmably setting the set/reset by the AP stored in the ROM 130, thereby controlling the operation of the DMA controller 110 so that the operation point of the DMA controller 110 is set by previously adding a program for controlling the state of the DMA control flag 170 to the AP of the ROM 130. Accordingly, flexibility and accuracy of debugging can be improved.

Second Embodiment

Figure 3:
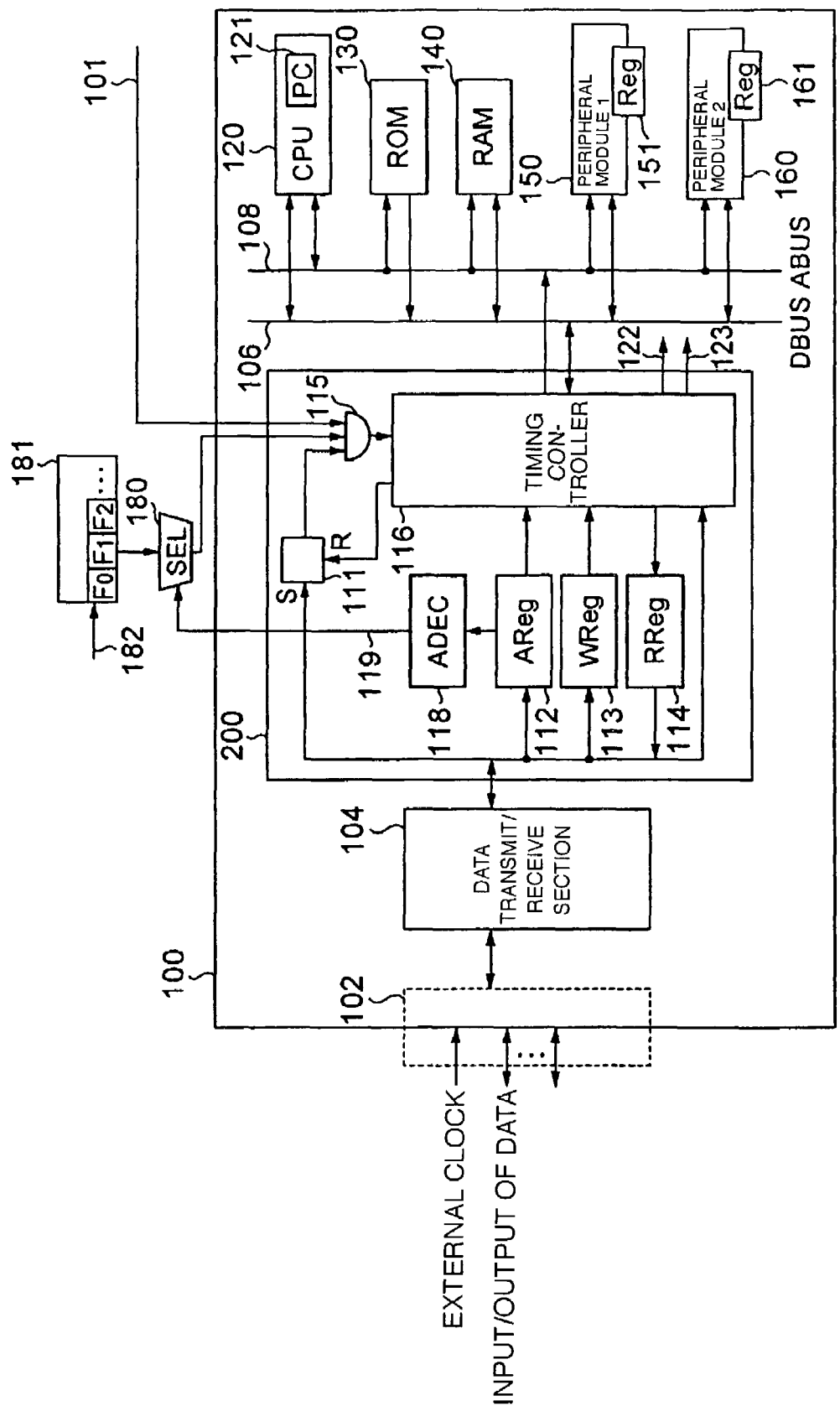
FIG. 3 is a block diagram showing an on-chip debugging method according to a second embodiment of the invention.

FIG. 3 is a block diagram showing the configuration of a MCU 100 according to a second embodiment of the invention. Since components which are depicted by the same reference numerals as those illustrated in FIGS. 1 and 2 have the same functions as those of MCU shown in FIGS. 1 and 2, a detailed explanation thereof is omitted.

In the second embodiment, a DRAM control flag group 181 and a selector (SEL) 180 are provided outside the MCU 100 instead of the DMA control flag 170 in the first embodiment. The DRAM control flag group 181 can set multiple flags in response to a command input 182 from the AP and each flag corresponds one by one to an internal module of the RAM and the like for executing read/write by a RAM monitor. For example, a RAM 140 corresponds to a flag F0, a peripheral module 1 (150) corresponds to a flag F1, and a peripheral module 2 (160) corresponds to a flag F2. Flag information is inputted to an AND gate 115 by way of the SEL 180.

In the second embodiment, an address decoder (ADEC) 118 is provided inside the MCU 100 for decoding an address stored in an AReg 112, and outputting a selection signal 119 for controlling the SEL 180.

(1) Reading Operation

An address of a RAM or addresses of registers, namely, the RAM 140, the peripheral module 1 (150) and the peripheral module 2 (160) which are provided in the MCU 100 and subjected to debugging are inputted from an external data i/o terminal in synchronization with an external clock from the external interface terminal group 102, and data necessary for the operation of a DMA controller 200 is set in an AReg 112 and the like. Upon completion of this setting, a GO flag set F/F 111 is set. At this time, if a bus state recognition signal has a significant value and a value of an output signal of the SEL 180 selected in response to the selection signal from the ADEC 118 has a significant value (e.g. a value "1"), the DMA controller 200 outputs a read signal 123 to the RAM or registers serving as objects to be read corresponding to set addresses and reads data in the RAM or registers and outputs the read data to the outside by way of a timing controller 116, a RRreg 114, the data transmit/receive section 104 and the external interface terminal group 102.

At this time, the ADEC 118 decodes the address serving as an object of the RAM monitor and recognizes which hardware serving as an object of the RAM monitor the address in concern corresponds to and outputs a signal for selecting a flag of the DRAM control flag group 181 to be used to the selector SEL 180.

(2) Writing Operation

An address of a RAM or addresses of registers, namely, the RAM 140, the peripheral module 1 (150) and the peripheral module 2 (160) which are provided in the MCU 100 and subjected to debugging and data to be written are inputted from the external data i/o terminal in synchronization with the external clock from the external interface terminal group 102, and data necessary for the operation of the DMA controller 200 is set in the AReg 112 and a WReg 113 by way of the data transmit/receive section 104. Upon completion of this setting process, a GO flag is set, and at this time if a bus state recognition signal has a significant value and a value of an output signal of the SEL 180 selected in response to the selection signal 119 from the ADEC 118 has a significant value, the DMA controller 200 outputs a write signal 122 to the RAM or registers as objects to be written corresponding to set addresses and writes data on the RAM or registers and outputs a signal indicating the completion of execution of writing to the outside by way of the timing controller 116, the data transmit/receive section 104 and the external interface terminal group 102.

In the second embodiment, since the DMA control flags are provided for each module serving as an object of a RAM monitor, even if the debug point is differentiated for every module, the debugging accuracy can be improved like the first embodiment.

Third Embodiment

Figure 4:
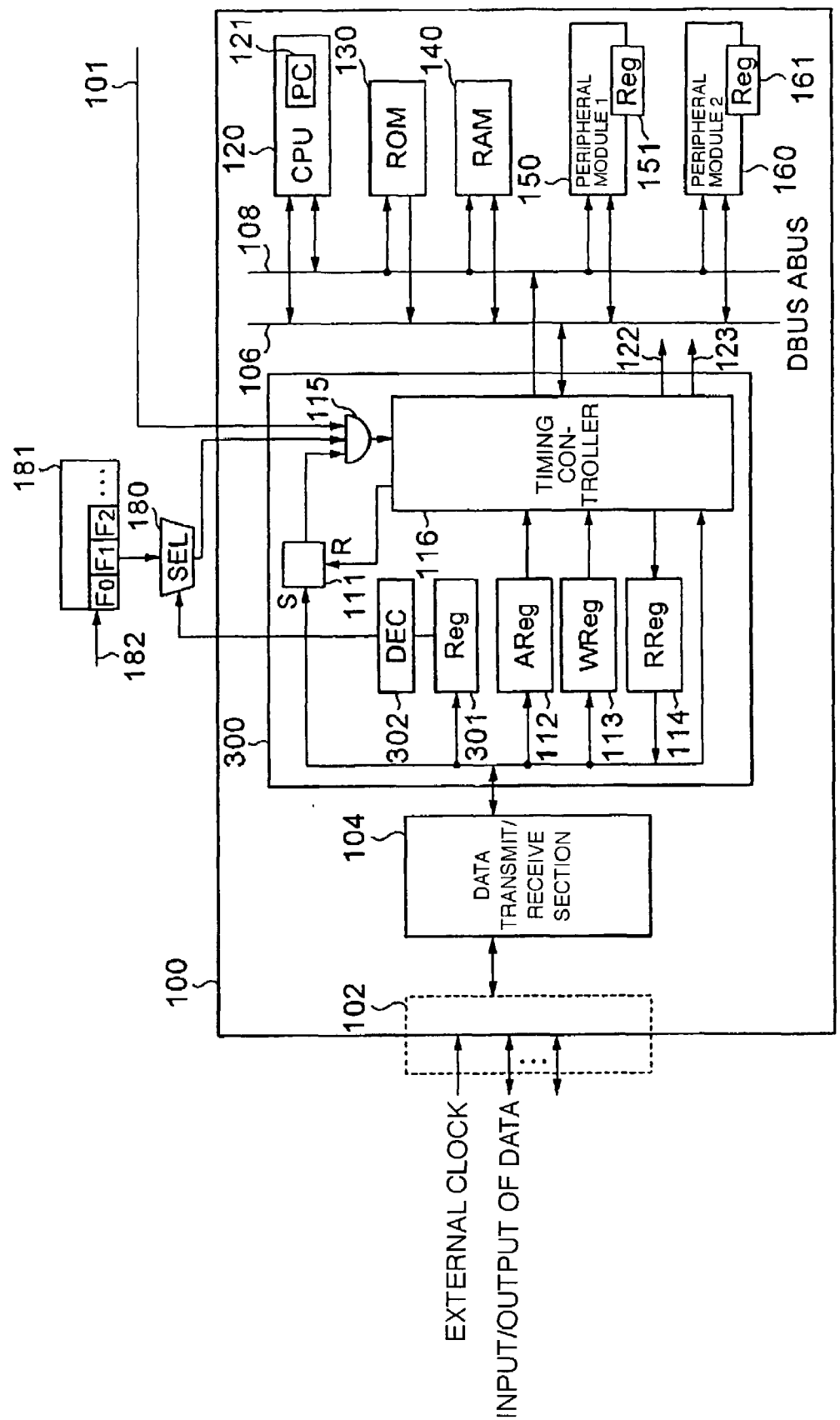
FIG. 4 is a block diagram showing an on-chip debugging method according to a third embodiment of the invention.

FIG. 4 is a block diagram showing the configuration of a MCU 100 according to a third embodiment of the invention. Since components which are depicted by the same reference numerals as those illustrated in FIGS. 1, 2 and 3 have the same functions as those of MCU shown in FIGS. 1, 2 and 3, a detailed explanation thereof is omitted.

A DMA controller 300 further includes, in addition to the components of the DMA controller 110 of the first embodiment, a DMA information register (Reg) 301 and a decoder (DEC) 302. The Reg 301 is a register for storing therein information relating to DMA inputted from an external interface terminal group 102, and this information indicates which information of DMA flag group is referred to.

(1) Reading Operation

In FIG. 4, address data of a RAM or registers, namely, a RAM 140, a peripheral module 1 (150), a peripheral module 2 (160), respectively serving as objects of debugging and DMA flag information data for specifying which flag information is referred to among a DRAM control flag group 181 are inputted to an external data i/o terminal in synchronization with an external clock of an external interface terminal group 102.

The inputted data is fetched such that the address data is fetched in an AReg 112, and DMA flag information data is fetched in a Reg 301, and the GO flag set F/F 111 for requesting reading operation by the RAM monitor is set at the same time upon completion of fetching of data.

The DMA controller 300 decodes the content of the DMA flag information register Reg 301 by the decoder DEC 302 and selects a flag to be referred to among the DMA control flag group 181 by the SEL 180 in response to the decoded signal. Each flag among the DRAM control flag group 181 according to the third embodiment can freely set a corresponding relation relative to a hardware although the flag according to the second embodiment corresponds to a hardware one by one. For example, assuming that according to the second embodiment, the flags F0, F1, F2 respectively correspond to the RAM 140, the peripheral module 1 (150) and the peripheral module 2 (160), these flags can be changed to respectively correspond to the peripheral module 2 (160), the peripheral module 1 (150) and the RAM 140 by a hardware, not shown.

A timing controller 116 for controlling a reading operation by the RAM monitor refers to states of three signals, i.e. a state of a Go flag, a selected DMA flag, and a bus state recognition signal 101 outputted from a CPU in the manner of in a hardware, and reserves the reading operation by the RAM monitor until these three signals are all set. If all the signals are set, the timing controller 116 starts the reading operation, and outputs data stored in an AReg 112, to an internal address bus (ABUS) 108, and also outputs a data read signal 123.

Data in the RAM or registers serving as objects of reading by the RAM monitor are outputted to an internal data bus DBUS 106 in synchronization with the read signal 123. The timing controller 116 stores data outputted to the DBUS 106 in a RReg 114 and resets the GO flag set F/F 111. The content of thus stored RReg 114, namely, the content of the RAM or registers serving as objects of reading by the RAM monitor are outputted to the outside by way of a data transmit/receive section 104 and an external interface terminal group 102.

(2) Writing Operation

In FIG. 4, address data of a RAM or registers, namely, a RAM 140, a peripheral module 1 (150), a peripheral module 2 (160), respectively serving as objects of debugging, write data and DMA flag information data for specifying which flag information is referred to among a DRAM control flag group 181 are inputted to an external data i/o terminal in synchronization with an external clock of an external interface terminal group 102.

Each inputted data is fetched such that an address data is fetched in the AReg 112, write data is fetched in the WReg 113, DMA flag information data is fetched in the DMA flag information register Reg 301, and the GO flag set F/F 111 for requesting reading operation by the RAM monitor is set at the same time upon completion of fetching of data.

The DMA controller 300 decodes the content of the DMA flag information register Reg 301 by the decoder DEC 302 and selects a flag to be referred to among the DMA control flag group 181 by the SEL 180 in response to the decoded signal. The relation between each flag of the control flag group 181 and each hardware according to the third embodiment can be varied in the same manner as mentioned above.

A timing controller 116 for controlling a writing operation by the RAM monitor refers to states of three signals, i.e. a state of a Go flag, a selected one DMA flag, a bus state recognition signal 101 outputted from a CPU in the manner of in a hardware and reserves the writing operation by the RAM monitor until these three signals are all set. If all the signals are set, the timing controller 116 starts the writing operation, and outputs data stored in an AReg 112, to an internal address bus (ABUS) 108, and also outputs a data write signal 122.

Data in the RAM or registers serving as objects of writing by the RAM monitor are outputted to a hardware serving as an object from the internal data bus DBUS 106 in synchronization with the write signal 122. The timing controller 116 resets the GO flag set F/F 111 upon completion of writing operation and outputs the completion of execution of writing to the outside by way of the data transmit/receive section 104 and the external interface terminal group 102.

According to the RAM monitor in the third embodiment, since the DMA control flags which are referred to by the RAM or registers serving as objects of monitor can be individually set, a debugging point which is finer than those of first and second embodiments can be set, thereby improving the efficiency of debugging.

What is claimed is:

1. A microcontroller provided with a function of reading from or writing to a built-in RAM or registers during execution of an application program, wherein said microcontroller comprises:

an external interface terminal group for executing transmission and reception of data relative to an outside; and a data transmit/receive section for executing transmission and reception of data between the external interface terminal group and a DMA controller;

wherein the DMA controller includes an address register for storing therein an address of a hardware serving as an object to be accessed by DMA, registers for executing reading or writing by the DMA, a control flag for controlling the start of the DMA, and a timing controller of the DMA;

wherein said microcontroller is coupled externally to a register for storing therein flag information for determining whether access can be executed or not by the DMA, and a unit for outputting a bus state recognition signal indicating whether a bus state of the microcontroller is in a state to be accessed or not by the DMA; and wherein, when (1) the flag information indicates that access can be executed by the DMA, (2) the bus state recognition signal indicates that the bus can be occupied by the DMA, and (3) the control flag inside the DMA controller indicates that access is started by the DMA, the built-in RAM or registers are accessed under the control of the timing controller of the DMA inside the DMA controller so that data is read from the RAM or registers to the outside of the microcontroller or data is written to the RAM or registers from the outside.

2. A microcontroller provided with a function of reading from or writing to a built-in RAM or registers during execution of an application program, wherein said microcontroller comprises:

an external interface terminal group for executing transmission and reception of data relative to an outside; and a data transmit/receive section for executing transmission and reception of data between the external interface terminal group and a DMA controller;

wherein the DMA controller includes an address register for storing therein an address of a hardware serving as an object to be accessed by DMA, a decoder for decoding a content of the address register, registers for executing reading or writing by the DMA, a control flag for controlling the start of the DMA, and a timing controller of the DMA;

wherein said microcontroller is coupled externally to a register for storing therein a DMA control flag group corresponding to each hardware one by one for executing access by the DMA, and a unit for outputting a bus state recognition signal indicating whether a bus state of the microcontroller is in a state to be accessed or not by the DMA; and wherein, when (1) flag selected from among the DMA control flag group in response to a signal outputted by the decoder indicates that a DMA operation is valid, (2) the bus state recognition signal indicates that the bus can be occupied by the DMA, and (3) the control flag inside the DMA controller indicates that access is started by the DMA, the built-in RAM or registers are accessed under the control of the timing controller of the DMA inside the DMA controller so that data is read from the RAM or registers to the outside of the microcontroller or data is written to the RAM or registers from the outside.

3. A microcontroller provided with a function of reading from or writing to a built-in RAM or registers during execution of an application program, wherein said microcontroller comprises:

an external interface terminal group for executing transmission and reception of data relative to an outside; and a data transmit/receive section for executing transmission and reception of data between the external interface terminal group and a DMA controller;

wherein the DMA controller includes an address register for storing therein an address of a hardware serving as an object to be accessed by DMA, a register for inputting data indicating which flag of a DMA control flag is referred to, a decoder for decoding a content of the register, registers for executing reading or writing by the DMA, a control flag for controlling the start of the DMA, and a timing controller of the DMA;

wherein said microcontroller is coupled externally to a register for storing therein a DMA control flag group indicating whether each hardware for executing access by the DMA can be accessed or not by the DMA, and a unit for outputting a bus state recognition signal indicating whether a bus state of the microcontroller is in a state to be accessed or not by the DMA; and wherein, when (1) a flag selected from among the DMA control flag group in response to a signal outputted by the decoder indicates that the DMA operation is valid, (2) the bus state recognition signal indicates that access can be executed by the DMA, and (3) the control flag inside the DMA controller indicates that access is started by the DMA, the built-in RAM or registers are accessed under the control of the timing controller of the DMA inside the DMA controller so that data is read from the RAM or registers to an outside of the microcontroller or data is written on the RAM or registers from the outside.

* * * * *